United States Patent
Yoo et al.

(10) Patent No.: US 9,728,345 B1
(45) Date of Patent: Aug. 8, 2017

(54) ULTRA CAPACITOR MODULE

(71) Applicant: LS Mtron Ltd., Anyang-si, Gyeonggi-do (KR)

(72) Inventors: Yong-Hyeon Yoo, Incheon (KR); Jung-Gul Lee, Anyang-si (KR)

(73) Assignee: LS MTRON LTD, Anyang-si, Gyeonggi-Do (KR)

( * ) Notice: Subject to any disclaimer, the term of this patent is extended or adjusted under 35 U.S.C. 154(b) by 0 days.

(21) Appl. No.: 15/361,826

(22) Filed: Nov. 28, 2016

Related U.S. Application Data (62) Division of application No. 14/910,057, filed on Feb. 4, 2016.

(51) Int. Cl.
| | | |
|---|---|---|
| *H01R 12/52* | (2011.01) | |
| *H01R 12/58* | (2011.01) | |
| *H01G 11/78* | (2013.01) | |
| *H02J 7/00* | (2006.01) | |
| *H05K 1/18* | (2006.01) | |
| *H01R 12/62* | (2011.01) | |
| *H01G 11/10* | (2013.01) | |

(Continued)

(52) U.S. Cl.
CPC ............ *H01G 11/78* (2013.01); *H01G 11/10* (2013.01); *H01G 11/76* (2013.01); *H01R 12/62* (2013.01); *H02J 7/0016* (2013.01); *H05K 1/181* (2013.01); *H02J 7/345* (2013.01); *H05K 2201/10015* (2013.01); *H05K 2201/10272* (2013.01)

(58) Field of Classification Search
CPC ........ H01G 11/10; H01G 11/76; H01G 11/78; H01G 11/181; H01R 12/62; H02J 7/0016; H02J 7/345; H05K 2201/10015; H05K 2201/10272
See application file for complete search history.

(56) References Cited

U.S. PATENT DOCUMENTS

| | | | | | |
|---|---|---|---|---|---|
| 4,480,289 | A | * | 10/1984 | Huffman | ................ H05K 3/301 |
| | | | | | 174/138 G |
| 4,878,155 | A | * | 10/1989 | Conley | ................. H01L 23/642 |
| | | | | | 174/263 |

(Continued)

FOREIGN PATENT DOCUMENTS

| | | |
|---|---|---|
| DE | 10 2010 041538 A1 | 3/2012 |
| JP | S62-46809 U | 3/1987 |

(Continued)

OTHER PUBLICATIONS

Search Report for International Application No. PCT/KR2014/007321.

*Primary Examiner* — Hoa C Nguyen
(74) *Attorney, Agent, or Firm* — LRK Patent Law Firm (57) ABSTRACT

An ultra capacitor module includes a first ultra capacitor having a first polar terminal provided with a screw thread A formed on an outer peripheral surface, a second ultra capacitor having a second polar terminal provided with a screw thread A formed on an outer peripheral surface, and a connecting member having a screw hole B formed corresponding to the screw thread A on an inner peripheral surface through which the first polar terminal is inserted from one side and the second polar terminal is inserted from the other side to connect the first and second ultra capacitors in series and having a gas emission hole formed from a center to an outer surface.

16 Claims, 10 Drawing Sheets

(51) Int. Cl.
*H01G 11/76* (2013.01)
*H02J 7/34* (2006.01)

(56) References Cited

U.S. PATENT DOCUMENTS

| | | | |
|---|---|---|---|
| 5,875,091 A * | 2/1999 | Rieken | H01R 13/6625 |
| | | | 361/328 |
| 6,327,137 B1 | 12/2001 | Yamamoto et al. | |
| 8,790,813 B2 | 7/2014 | Murata et al. | |
| 2003/0133251 A1 * | 7/2003 | Kitagawa | H01G 2/06 |
| | | | 361/328 |
| 2004/0136170 A1 * | 7/2004 | Tsunezaki | H01G 2/04 |
| | | | 361/810 |
| 2006/0050468 A1 * | 3/2006 | Inoue | H01G 2/04 |
| | | | 361/328 |
| 2006/0264108 A1 | 11/2006 | Shimamori et al. | |
| 2007/0020513 A1 | 1/2007 | Medina et al. | |
| 2007/0146965 A1 | 6/2007 | Mitchell et al. | |
| 2008/0049408 A1 * | 2/2008 | Yamauchi | H01G 2/14 |
| | | | 361/772 |
| 2008/0068801 A1 | 3/2008 | Wilk | |
| 2008/0169768 A1 * | 7/2008 | Yang | H05K 1/18 |
| | | | 315/276 |
| 2009/0004558 A1 | 1/2009 | Miyazaki et al. | |
| 2012/0315807 A1 * | 12/2012 | Sakae | H01M 2/206 |
| | | | 439/887 |
| 2013/0025924 A1 * | 1/2013 | Sasahara | H05K 3/301 |
| | | | 174/260 |
| 2013/0105210 A1 * | 5/2013 | Morita | H01G 11/76 |
| | | | 174/260 |

FOREIGN PATENT DOCUMENTS

| | | |
|---|---|---|
| JP | 2000-21684 A | 1/2000 |
| JP | 2000-49057 A | 2/2000 |
| JP | 2001-85281 A | 3/2001 |
| JP | 2009-009852 A | 1/2009 |
| JP | 2012-252811 A | 12/2012 |
| KR | 10-2002-0007255 A | 1/2002 |
| KR | 10-2006-0119772 A | 11/2006 |
| KR | 10-2012-0017697 A | 2/2012 |
| WO | 2011/021253 A1 | 2/2011 |

* cited by examiner

ULTRA CAPACITOR MODULE

CROSS-REFERENCE TO RELATED APPLICATION(S)

This application is a division of U.S. patent application Ser. No. 14/910,057, filed Feb. 4, 2016, which was National Stage entry from International Application No. PCT/KR2014/007321, filed Aug. 7, 2014, which claimed priority to Korean Patent Application Nos. 10-2013-0093635, filed Aug. 7, 2013, 10-2013-0100930, filed Aug. 26, 2013, 10-2014-0101308, filed Aug. 6, 2014, and 10-2014-0101312, filed Aug. 6, 2014, the disclosures of which are incorporated in their entireties herein by reference.

BACKGROUND OF THE INVENTION

1. Field of the Invention

The present disclosure relates to an ultra capacitor module, and more particularly, to an ultra capacitor module allowing easy connection between ultra capacitors and with an improved connecting structure of a balancing board.

2. Description of Related Art

Generally, a battery and a capacitor are a typical device for storing electrical energy.

An ultra capacitor, also known as a super capacitor, has intermediate characteristics between an electrolytic condenser and a secondary battery, and due to high efficiency and semi-permanent if characteristics, is considered the next-generation energy storage device as an alternative to a secondary battery or usable in combination with a secondary battery.

In the application of an ultra capacitor, a high voltage module of several thousands of Farads (F) or several hundreds of voltages V is needed for use as a high voltage battery. A high voltage module is implemented as a high voltage ultra capacity assembly including as many ultra capacitors, also called unit cells, as needed connected in series. In this instance, the high voltage ultra capacity assembly is made by connecting the plurality of ultra capacitors by a busbar and fastening them with a nut.

However, the foregoing-structured ultra capacity assembly needs a plurality of busbars and nuts to connect a plurality of ultra capacitors. For example, to connect three ultra capacitors in series, one busbar and two nuts are needed to connect an anode terminal of a first ultra capacitor to a cathode terminal of a second ultra capacitor. Also, one busbar and two nuts are needed to connect an anode terminal of the second ultra capacity to a cathode terminal of a third ultra capacitor. Thus, to connect three ultra capacitors in series, two busbars and four nuts are needed in total. That is, to connect N ultra capacitors, N−1 busbars and 2*(N−1) nuts are needed.

This ultra capacitor module has a drawback in that as the number of ultra capacitors connected in series increases, production costs rise and product assembly operations increase in number with the increasing number of components. Also, since the entire connecting structure increases in resistance due to the presence of the contact resistance between the busbar and the ultra capacitor, there is a problem of a large amount of heat being generated.

Also, the high voltage ultra capacitor module made by connecting in series is susceptible to cell voltage imbalance during charge, standby or discharge due to a characteristic parameter difference. Through this, cell aging is accelerated and the life of the module is shortened, for example, a capacity of a state of charge (SOC) of the module is reduced. Also, in some cases, a certain cell may break down or explode due to its overvoltage.

Generally, a balancing board having a balancing function controls the cell voltage by connecting to a harness and a bolting part formed on an outer surface of a nut connecting adjacent cells.

However, the above-mentioned configuration has a disadvantage in that production costs are subject to increase due to an additional process of forming the bolting part on the nut. Also, to ease the connection of the harness connecting the bolting part and the balancing board, the bolting part must run in a fixed direction; however, there is a drawback in that it is difficult to fix the bolting part in one direction.

Also, there is a disadvantage in that a separate structure is needed to fix the balancing board.

SUMMARY OF THE INVENTION

The present disclosure is designed to solve the above problems, and therefore the present disclosure is directed to providing an ultra capacitor module that may prevent production costs from rising with the increasing number of components for coupling when connecting a plurality of ultra capacitors in series and may reduce the operation time of product assembly, while improving heat transfer performance.

Also, the present disclosure is directed to providing an ultra capacitor module having a structure of providing a balancing board formed at one side of an ultra capacitor and rotating the balancing board.

These and other objects and aspects of the present disclosure can be understood by the following description, and will become apparent from the embodiments of the present disclosure. Also, it should be understood that these and other objects and aspects of the present disclosure may be achieved by any means in the scope of the disclosure and combinations thereof.

To achieve the above objects, an ultra capacitor module according to one aspect of the present disclosure includes a first ultra capacitor having a first polar terminal provided with a screw thread A formed on an outer peripheral surface, a second ultra capacitor having a second polar terminal provided with a screw thread A formed on an outer peripheral surface, and a connecting member having a screw hole B formed corresponding to the screw thread A on an inner peripheral surface through which the first polar terminal is inserted from one side and the second polar terminal is inserted from the other side to connect the first and second ultra capacitors in series and having a gas emission hole formed from a center to an outer surface.

The ultra capacitor module may further include a printed circuit board (PCB) having, at a center, a hole through which the second polar terminal of the second ultra capacitor and a terminal having the second polar terminal are inserted and penetrate, and an elastic member having, at a center, a hole through which the second polar terminal of the second ultra capacitor and the terminal having the second polar terminal are inserted and penetrate, and disposed between the second ultra capacitor body and the PCB.

A height of the connecting member may be greater than a sum of lengths of the first polar terminal and the second polar terminal.

The PCB may have a cell balancing function of controlling voltage of the ultra capacitor.

A connector may be provided at one side of the PCB, and a harness may be connected to the connector.

The elastic member may push up the PCB to come into contact with the connecting member and allow rotation of the PCB.

The elastic member may be a wave washer.

A groove may be formed on an outer surface of the PCB to facilitate the rotation of the PCB.

A diameter of the elastic member may be greater than a diameter of the hole formed at the center of the PCB and smaller than a diameter of the PCB.

To achieve the above objects, an ultra capacitor module according to another aspect of the present disclosure includes a terminal formed at one side of an ultra capacitor body, a polar terminal disposed on the terminal and having a screw thread formed on an outer peripheral surface, a printed circuit board (PCB) having, at a center, a hole through which the polar terminal and the terminal are inserted and penetrate, a nut having a screw hole corresponding to the screw thread on an inner peripheral surface and coupled with the polar terminal, and an elastic member having, at a center, a hole through which the polar terminal and the terminal are inserted and penetrate and disposed between the ultra capacitor body and the PCB.

The ultra capacitor module may further include a busbar having, at a center, a hole through which the polar terminal is inserted and penetrates and disposed between the nut and the PCB, and a metal member disposed between the nut and the PCB to separate the busbar from the PCB.

The PCB may have a cell balancing function of controlling voltage of the ultra capacitor.

A connector may be provided at one side of the PCB.

The elastic member may be a wave washer.

A groove may be formed on an outer surface of the PCB to facilitate the rotation of the PCB.

A diameter of the elastic member may be greater than a diameter of the hole formed at the center of the PCB and smaller than a diameter of the PCB.

The nut may have a gas emission hole formed from a center to an outer surface.

The ultra capacitor module may further include a busbar having a central hole portion formed curved vertically in a direction coming into contact with the PCB.

The gas emission hole is formed from a center of an upper surface of an electrode in a lengthwise direction abutting the gas emission hole towards an outer surface along a predetermined distance and is then bent to go straight through to a side surface of the connecting member, or the gas emission hole is formed such that it goes from a center of an upper surface of an electrode in a lengthwise direction abutting the gas emission hole straight through to a side surface of the connecting member.

The gas emission hole is formed at a side central portion of the connecting member, and is formed to run through the inside and outside of the connecting member.

BRIEF DESCRIPTION OF THE DRAWINGS

The accompanying drawings illustrate a preferred embodiment of the present disclosure and together with the foregoing disclosure, serve to provide further understanding of the technical spirit of the present disclosure, and thus, the present disclosure is not construed as being limited to the drawings.

DETAILED DESCRIPTION OF THE INVENTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

Also, in the description of the present disclosure, when it is deemed that specific explanation of related well-known constructions or functions may obscure the essence of the invention, their detailed description is omitted.

Figure 1:
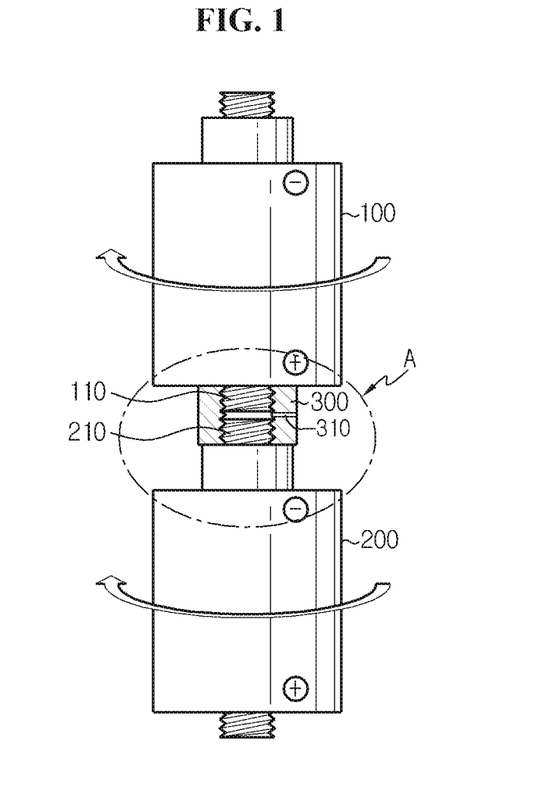
FIG. 1 is a diagram illustrating an ultra capacitor module coupled by a nut according to an exemplary embodiment of the present disclosure.
Figure 2:
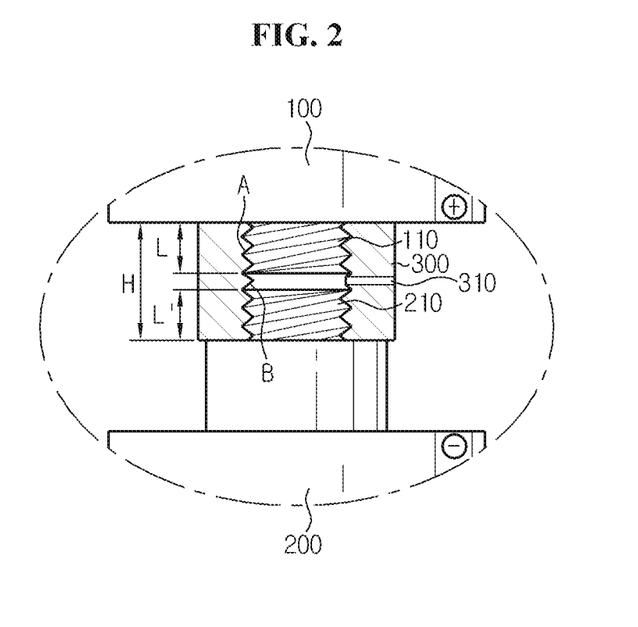
FIG. 2 is an enlarged view of section A of FIG. 1.

FIG. 1 is a diagram illustrating an ultra capacitor module coupled by a nut according to an exemplary embodiment of the present disclosure, and FIG. 2 is an enlarged view of section A of FIG. 1.

Referring to FIGS. 1 and 2, the ultra capacitor module according to the present disclosure may include a plurality of ultra capacitors 100 and 200 and a connecting member 300.

The ultra capacitor corresponds to an energy storage device having fast charge and discharge characteristics, and may include a cathode terminal formed on one surface and an anode terminal on the other surface and have a cylindrical shape.

The ultra capacitor is used instead of a storage battery in the application requiring fastidious maintenance and repair and a long-term service life. Also, the ultra capacitor is used as an auxiliary power source of mobile communication information equipment such as mobile phones, laptop computers, personal digital assistances (PDAs), and the like. Also, the ultra capacitor is quite suitable and widely used as a main or auxiliary power source of an electric vehicle or hybrid vehicle requiring high capacity, a power supply for a solar cell, an uninterruptible power supply (UPS), and the like.

Because voltage of the ultra capacitor is just 3V or less, a plurality of ultra capacitors may be connected in series for high voltage applications. In this instance, adjacent ultra capacitors may be connected by one connecting member 300.

That is, such connection may be established by coupling a cathode terminal 110 formed on one surface of the first ultra capacitor 100 to an anode terminal 210 formed on the other surface of the second ultra capacitor 200 using the connecting member 300. To connect a plurality of ultra capacitors, for example, at least two ultra capacitors, the above process may be repetitively performed, so that the ultra capacitors may be connected in series.

Specifically, a screw thread A is formed along outer peripheral surfaces of the cathode terminal 110 and the anode terminal 210 of the ultra capacitors, and a screw hole B having a shape corresponding to the screw thread A of the cathode terminal 110 and the anode terminal 210 is formed along an inner peripheral surface of the connecting member 300. The screw thread A and the screw hole B are formed in the same direction.

The cathode terminal 110 of the first ultra capacitor may be connected to one side of the connecting member 300 and the anode terminal 210 of the second ultra capacitor 200 may be connected to the other side of the connecting member 300, and by rotating in the same direction, the ultra capacitors may be connected in series in a lengthwise direction along which the cathode terminal and the anode terminal are formed. That is, because the screw hole B formed on the inner peripheral surface of the connecting member is formed in the same direction, when connecting two ultra capacitors in series, coupling may be made by placing the ultra capacitors at both sides of a bolt, and in this state, rotating only the bolt in one direction, thereby easing a coupling operation.

However, the present disclosure is not limited thereto, and the screw threads A formed on the cathode terminal and the anode terminal of the ultra capacitors may be formed in a different direction from one another. Accordingly, the cathode terminal 110 of the first ultra capacitor may be connected to one side of the connecting member 300 and the anode terminal 210 of the second ultra capacitor 200 may be connected to the other side of the connecting member 300, and by rotating in the opposite directions, the ultra capacitors may be connected in series in a lengthwise direction along which the cathode terminal and the anode terminal are formed.

A gas emission hole 310 may be formed at one side of the connecting member 300.

The gas emission hole 310 according to this exemplary embodiment may be formed at a side central portion of the connecting member 300, and may be formed to run through the inside and outside of the connecting member 300.

Gas is generated during charging and discharging of the plurality of ultra capacitors, and in this instance, if the gas is not emitted outside, an explosion may occur.

Accordingly, the gas emission hole 310 serves to emit gas generated during charging and discharging of the ultra capacitors.

As described in the foregoing, the ultra capacitor module made by connecting in series is susceptible to voltage imbalance of the cells or the ultra capacitors during charge, standby or discharge due to a characteristic parameter difference. Thereby, aging of the ultra capacitors may be accelerated and the life of the module such as SOC may be shortened. Also, in some cases, a certain ultra capacitor may break down or explode due to its overvoltage. Accordingly, the ultra capacitor module according to the present disclosure may include a printed circuit board (PCB) (500 of FIG. 4) having a cell balancing function to control the voltage of the cells or the ultra capacitors.

A detailed description of the PCB will be provided below with reference to FIGS. 4 through 6.

As shown in FIG. 2, when the connection of the plurality of ultra capacitors is completely established, a height (H) of the connecting member 300 is greater than a sum (L+L') of a length of the cathode terminal 110 of the first ultra capacitor 100 and a length of the anode terminal 210 of the second ultra capacitor 200. This is taken into consideration because a short circuit occurs when the plurality of ultra capacitors, after being connected come into direct contact with one another, resulting in explosion as well as failure to function as an electrode.

Preferably, the connecting member 300 may be a nut made of a metal material having electrical conductivity.

Figure 3:
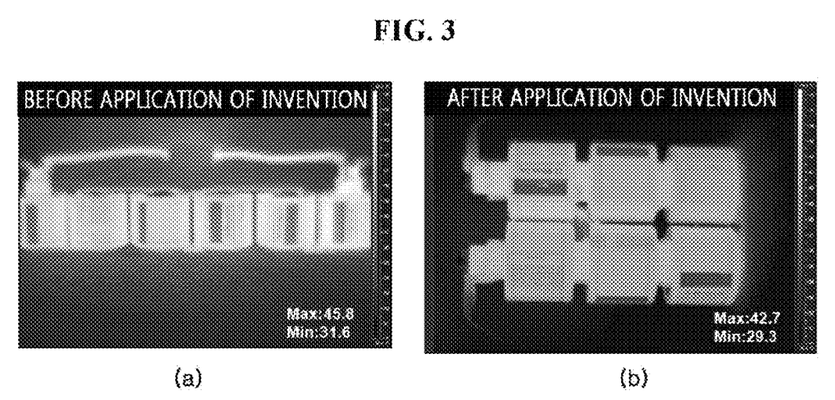
FIG. 3 is a diagram illustrating a heat transfer performance difference between an ultra capacitor module (a) according to a related art and the ultra capacitor module (b) of FIG. 1.

FIG. 3 is a diagram illustrating a heat transfer performance difference between an ultra capacitor module (a) according to a related art and the ultra capacitor module (b) of FIG. 1.

Referring to FIG. 3, the ultra capacitor module (a) according to the related art may include, when connecting a plurality of ultra capacitors, a plurality of busbars for connection and nuts for fixing the coupling of the busbars.

Meanwhile, in the ultra capacitor module of FIG. 1, all the adjacent ultra capacitors are connected in series in a lengthwise direction along which the cathode terminal and the anode terminal are formed, as described with reference to FIGS. 1 and 2. In this embodiment, first and second ultra capacitor assemblies are made by connecting each three ultra capacitors as described in the foregoing, and the first and second ultra capacitor assemblies are connected to one another using a busbar. In this instance, the busbar may be coupled to the first and second ultra capacitor assemblies by a nut or welding.

This embodiment was intended to investigate a heat transfer performance difference by connecting six ultra capacitors in total, and the result of the experiment is shown in Table 1.

TABLE 1

| Temperature | (a) | (b) |
|---|---|---|
| Max | 45.8 | 42.7 |
| Min | 31.6 | 29.3 |

That is, when connecting ultra capacitors according to a related art, besides a nut, a busbar may also be included to connect two adjacent ultra capacitors ((a) of FIG. 3). In this instance, the busbar generates the contact resistance which increases the resistance of the entire connection structure, that is, the module, and thus, when an electric current flows through the module, higher heat may be generated.

On the contrary, when connecting ultra capacitors according to the present disclosure ((b) of FIG. 3), only one connecting member, that is, a nut is included to connect two adjacent ultra capacitors. Therefore, it can be seen that the present disclosure has an effect of improving the heat transfer performance in comparison to the related art as shown in Table 1 when an electric current flows through the entire structure, that is, the module, by reducing the resistance of the module (heat transfer improvement effect by about 5% or more when compared to the related art).

Figure 4:
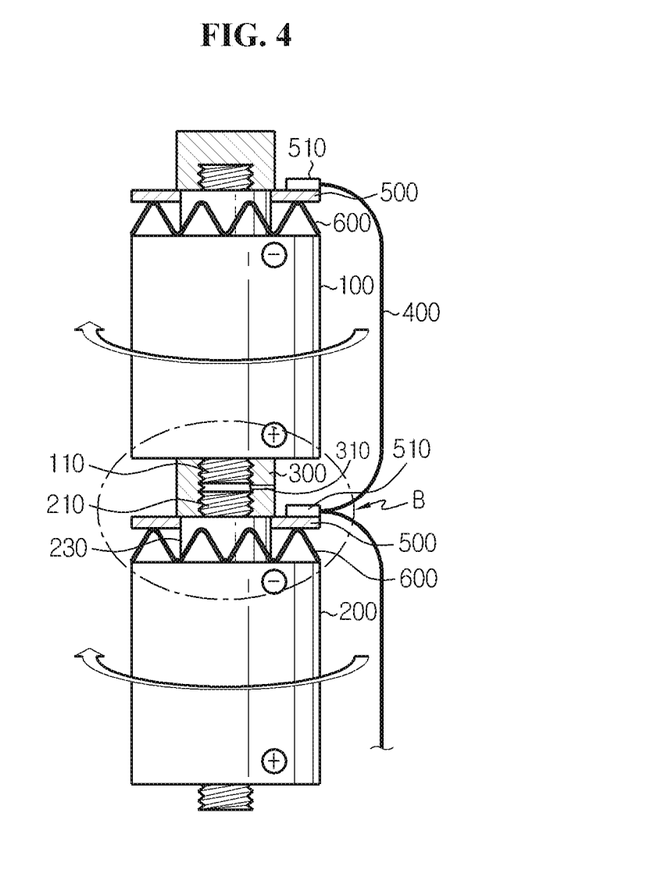
FIG. 4 is a diagram illustrating an ultra capacitor module according to another exemplary embodiment of the present disclosure.
Figure 5:
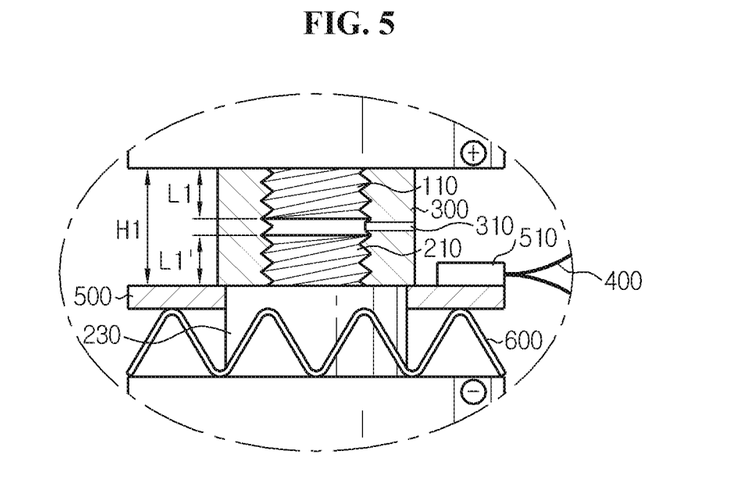
FIG. 5 is an enlarged view of section B of FIG. 4.

FIG. 4 is a diagram illustrating an ultra capacitor module according to another exemplary embodiment of the present disclosure, and FIG. 5 is an enlarged view of section B of FIG. 4.

In the description of FIGS. 4 and 5, because elements denoted by the same reference numerals as those of FIGS. 1 and 2 are described with reference to FIGS. 1 and 2, their description is omitted herein.

Referring to FIGS. 4 and 5, the ultra capacitor module according to the present disclosure may include a PCB 500 and an elastic member 600.

The PCB 500 is disposed below the connecting member 300 to perform a cell balancing function of controlling the voltage of the cells or the ultra capacitors. Specifically, the PCB 500 has a hole corresponding to a terminal 230 formed at one side of the ultra capacitor body at the center thereof, and may be coupled to the terminal 230 formed at one side of the ultra capacitor body. In this instance, the elastic member 600, that is, a member having an elastic property, preferably, a wave washer, may be provided below the PCB 500, and when the adjacent ultra capacitors are connected by the connecting member 300, the PCB 500 is pushed up to the side of the connecting member 300 by the elastic property of the elastic member 600 so that the PCB 500 comes into contact with the connecting member 300. Meanwhile, for the PCB 500 pushed up to the side of the connecting member 300 by the elastic member 600 to come into contact with the connecting member 300 in a proper manner, a diameter of the connecting member 300 should be larger than a diameter of the hole formed at the center of the PCB 500. Otherwise, if the diameter of the hole formed at the center of the PCB 500 is larger than the diameter of the connecting member 300, the PCB 500 is pushed up to the side of the connecting member 300 by the elastic property of the elastic member 600 and gets out of the connecting member 300, resulting in failure to contact with the connecting member 300.

Preferably, the elastic member 600 has, at the center, a hole corresponding to the terminal 230 formed at one side of the ultra capacitor body. Thus, as the terminal 230 is inserted and penetrates through the hole formed at the center of the elastic member 600, coupling is made.

In this instance, to push up the PCB 500, a diameter of the elastic member 600 should be greater than a diameter of the hole formed at the center of the PCB 500. Also, to minimize the interference of an operator and a harness during an operation, the diameter of the elastic member 600 should be smaller than a diameter of the PCB 500.

In this instance, the diameter of the hole formed at the center of the elastic member should be greater than a diameter of the terminal and smaller than the diameter of the hole formed at the center of the PCB 500.

The reason is to push up the PCB 500 to come into contact with the connecting member when the elastic member 600 is inserted into the terminal 230 and located under the PCB.

Also, because the PCB 500 is not coupled directly by the connecting member 300, the PCB 500 can be rotated, and thus, placement of a connector 510 formed at one side of the PCB 500 may be set to one direction.

A groove 610 is formed on an outer surface of the PCB 500, and when an operator rotates the PCB 500 using the groove 610 with a hand or a tool, the connector 510 may be aligned in one direction. The connector 510 formed at one side of the PCB 500 allows the connection of the PCBs 500 by connecting to a harness 400, so a cell balancing function of controlling the voltage of the cells or the ultra capacitors may be performed.

Figure 6:
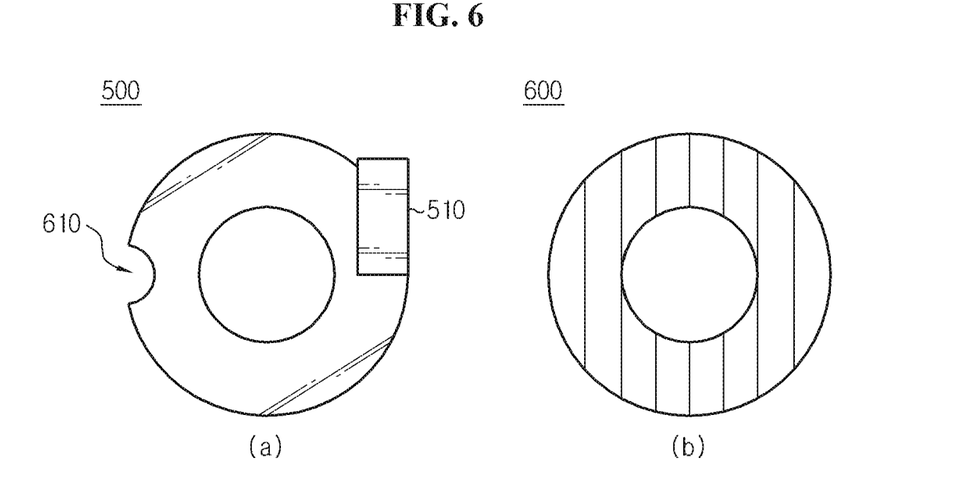
FIG. 6 is a plane view of a printed circuit board (PCB) and an elastic member of FIG. 4.
Figure 7:
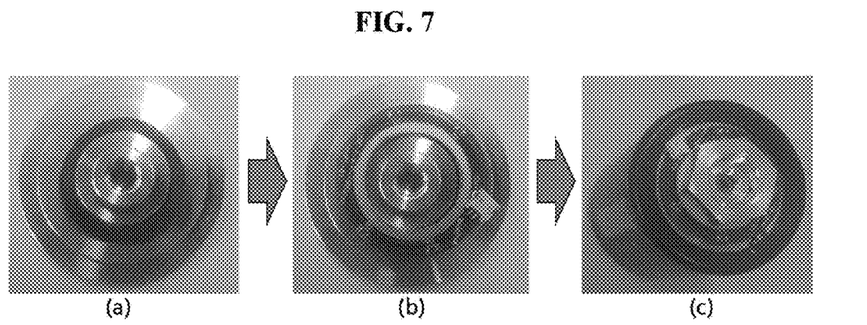
FIG. 7 is a diagram illustrating an assembly process of an elastic member (a), a PCB (b), and a connecting member (c) of FIG. 4.

FIG. 6 is a plane view of the PCB and the elastic member of FIG. 4, and FIG. 7 is a diagram illustrating an assembly process of the elastic member (a), the PCB (b), and the connecting member (c) of FIG. 4.

As shown in FIG. 7, the elastic member 600, the PCB 500, and the connecting member 300 are coupled in a sequential order to the terminal 230 formed at one side of the second ultra capacitor body. Also, the cathode terminal 110 of the first ultra capacitor 100 is coupled to the other surface of the connecting member 300. Thereby, the adjacent first and second ultra capacitors 100 and 200 may be connected in series in a lengthwise direction in which the anode terminal 210 and the cathode terminal 110 are formed.

In this instance, because the PCB 500 has the groove 610 formed in a certain part of the outer surface as shown in (a) of FIG. 6, a user may easily rotate the PCB 500 using the groove 610 with a hand or a tool.

Also, as shown in FIG. 5, when the connection of the plurality of ultra capacitors is completely established a height (H1) of the connecting member 300 is greater than a sum (L1+L1') of a length of the cathode terminal 110 of the first ultra capacitor 100 and a length of the anode terminal 210 of the second ultra capacitor 200. This is taken into consideration because a short circuit occurs when the plurality of capacitors, after being connected, come into direct contact with one another, resulting in explosion as well as failure to function as an electrode.

In the present disclosure, the connecting member 300 preferably may be a nut made of a metal material having electrical conductivity.

Figure 8:
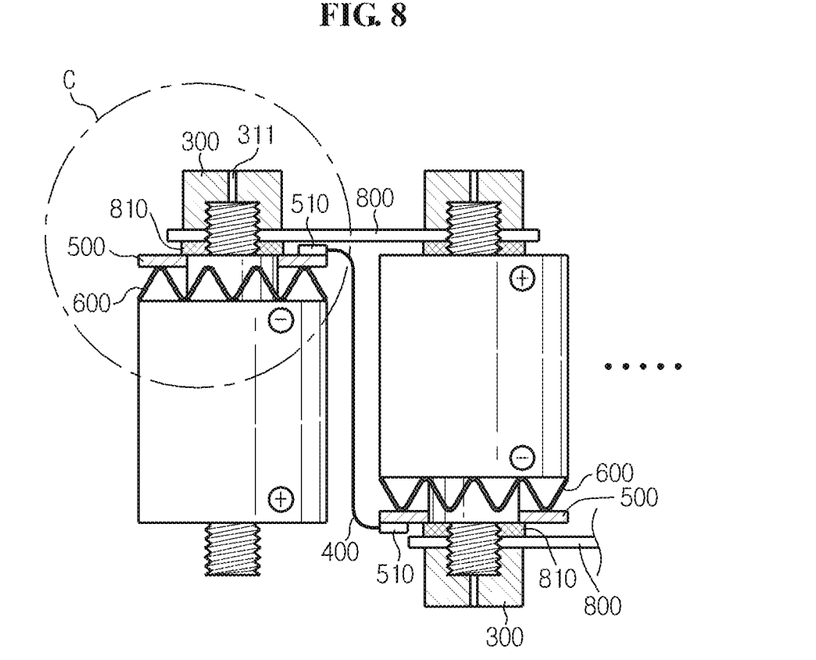
FIG. 8 is a diagram illustrating an ultra capacitor module according to still another exemplary embodiment of the present disclosure.
Figure 9:
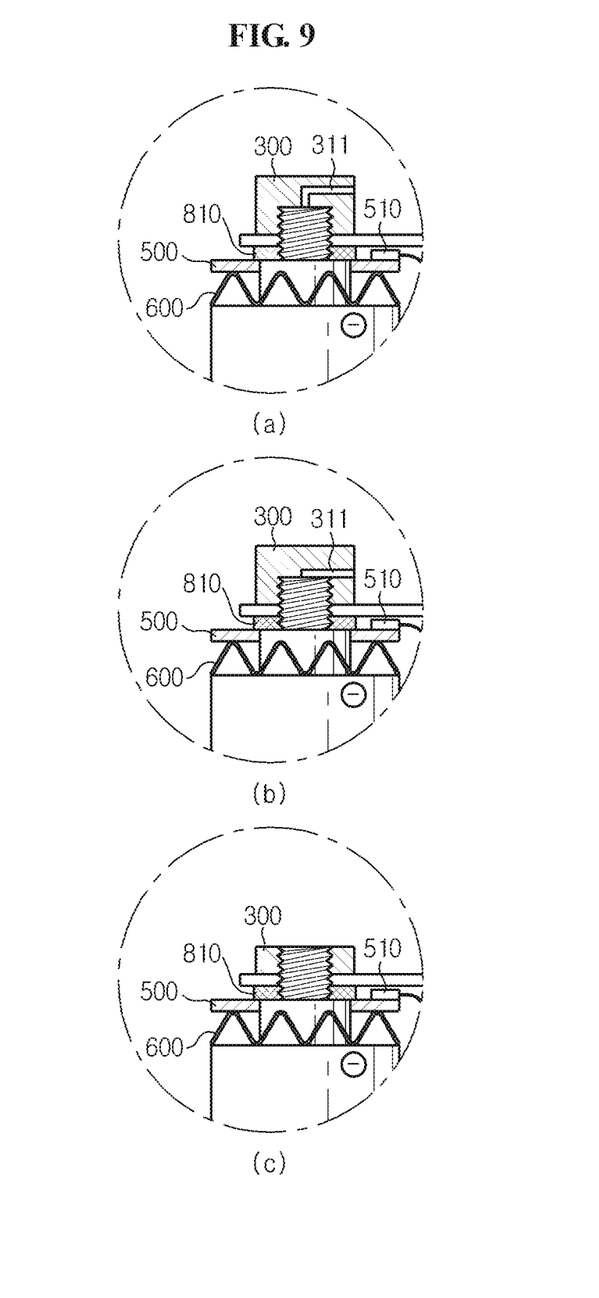
FIG. 9 is an enlarged view of section C of FIG. 8, illustrating a gas emission hole of various shapes formed in a connecting member.

FIG. 8 is a diagram illustrating an ultra capacitor module according to still another exemplary embodiment of the present disclosure, and FIG. 9 is an enlarged view of section C of FIG. 8, illustrating a gas emission hole of various shapes formed in a connecting member.

In the description of FIGS. 8 and 9, because elements denoted by the same reference numerals as those of FIGS. 1 and 2 and FIGS. 4 and 5 are described with reference to FIGS. 1 and 2 and FIGS. 4 and 5, their description is omitted herein.

Referring to FIGS. 8 and 9, the ultra capacitor module according to still another exemplary embodiment of the present disclosure may include a busbar 800 and a metal member 810.

The busbar 800 may connect a first ultra capacitor and a second ultra capacitor by arranging the ultra capacitors in parallel and connecting in series.

The busbar 800 may be in a shape of a plate, and may have holes at left and right sides symmetrically with respect to the center to connect adjacent ultra capacitors in series.

Specifically, coupling is made by arranging an anode terminal of a first ultra capacitor and a cathode terminal of an adjacent second ultra capacitor in parallel, and inserting and passing the electrode terminals through the holes formed at the center on the left and right sides of the busbar 800. In this instance, the coupling may be tightened by using the terminals extending out beyond the busbar 800 in conjunction with the connecting member 300, that is, a nut.

According to the description of FIGS. 4 and 5, the PCB 500 is disposed under the connecting member 300, that is, a nut, and as shown in (b) of FIG. 6, the elastic member 600, for example, a wave washer is disposed under the PCB 500.

However, as shown in FIG. 8, according to still another exemplary embodiment of the present disclosure, the busbar 800 is present under the connecting member 300, that is, a nut, to connect in series the plurality of ultra capacitors arranged in parallel. Thus, when the PCB 500 is disposed immediately under the busbar 800, the PCB 500 cannot rotate and a circuit on the PCB 500, that is, a circuit of a part coming into contact with the busbar 800 may be damaged.

Accordingly, the metal member 810 may be disposed between the busbar 800 and the PCB 500.

The metal member 810 may be disposed between the busbar 800 and the PCB 500 to serve to assist the rotation of the PCB 500 and keep the PCB 500 from directly coming into contact with the busbar 800 thereby preventing damage to the circuit on the PCB 500, that is, the circuit of the part coming into contact with the busbar 800.

In this instance, the metal member 810 may be a metal material having an elastic property and electrical conductivity, and may be in a form of a circular ring of a plate shape.

The reason that the metal member 810 has electrical conductivity is to electrically connect the PCB 500 to the busbar 800.

Thus, a diameter of the metal member 810 should be greater than the diameter of the hole formed at the center of the PCB 500 and smaller than the diameter of the PCB 500.

Accordingly, the PCB 500 pushed up to the metal member 810 by the elastic member 600 may come into contact with the metal member 810 properly. In contrast, if the diameter of the hole formed at the center of the PCB 500 is greater than the diameter of the metal member 810, the PCB 500 is pushed up to the metal member 810 by the elastic force of the elastic member 600 and goes through the metal member 810, as a consequence, the contact with the metal member 810 is not achieved.

Also, if the diameter of the metal member 810 is greater than the diameter of the PCB 500, the circuit of the PCB 500 may be damaged.

Accordingly, the diameter of the metal member 810 should be smaller than the diameter of the PCB 500 and should not depart from a predetermined peripheral area including the hole formed at the center of the PCB 500 to prevent the circuit of the PCB 500 from being damaged. In this instance, the predetermined peripheral area including the hole formed at the center of the PCB 500 does not have a circuit therein and is made of a conductive material to allow for an electrical connection.

Also, the connecting member 300 may have a gas emission hole 311 formed from the center of an upper surface of the electrode in the lengthwise direction abutting the gas emission hole 311 towards the outer surface.

During charging and discharging of the plurality of ultra capacitors, gas is generated, and in this instance, if the gas is not emitted outside, an explosion may occur.

Accordingly, the gas emission hole 311 serves to emit gas generated during charging and discharging of the ultra capacitors.

In this instance, the reason that the gas emission hole 311 is formed from the center of the upper surface of the electrode in the lengthwise direction abutting the gas emission hole 311 towards the outer surface is that gas generated during charging and discharging of the ultra capacitors is emitted through the hole formed at the center of the electrode.

However, the gas emission hole 311 is not limited thereto, and as shown in (a) and (b) of FIG. 9, the gas emission hole 311 may be formed in various shapes. More specifically, as shown in (a) of FIG. 9, the gas emission hole 311 is formed from the center of an upper surface of the electrode in the lengthwise direction abutting the gas emission hole 311 towards the outer surface along a predetermined distance and is then bent to go straight through to the side surface of the connecting member 300. Also, as shown in (b) of FIG. 9, the gas emission hole 311 is formed such that it goes from the center of an upper surface of the electrode in the lengthwise direction abutting the gas emission hole 311 straight through to the side surface of the connecting member 300. That is, the gas emission hole 311 may have any shape of emitting gas generated during charging and discharging of the electrode outside of the connecting member 300.

Also, as shown in (c) of FIG. 9, the connecting member 300 may have, at the center, a hole through which the electrode terminal is inserted and penetrates, that is, a hollow, to emit gas generated during charging and discharging of the electrode, without forming a separate gas emission hole.

Figure 10:
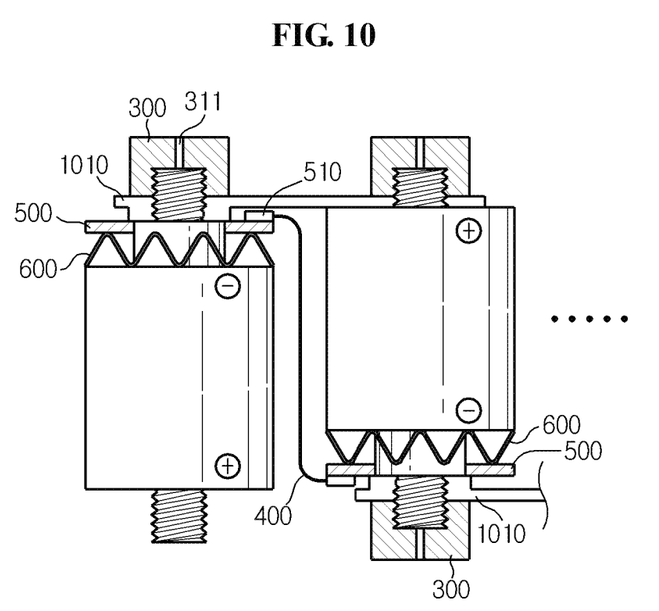
FIG. 10 is a diagram illustrating an ultra capacitor module according to yet another exemplary embodiment of the present disclosure.

FIG. 10 is a diagram illustrating an ultra capacitor module according to yet another exemplary embodiment of the present disclosure.

In the description of FIG. 10, because elements denoted by the same reference numerals as those of FIG. 9 are described with reference to FIG. 9, their description is omitted herein.

Referring to FIG. 10, a busbar 1010 according to the present disclosure may have a central hole portion formed curved vertically which comes into contact with the PCB 500.

That is, the busbar 1010 may be formed such that an area corresponding to the metal member 810 of FIG. 8 and the busbar 1010 are integrally formed and a central hole portion of the busbar 1010 is vertically curved.

As described in the foregoing, the ultra capacitor module according to the present disclosure includes the PCB 500 having a cell balancing function below the connecting member 300 connecting adjacent ultra capacitors, thereby eliminating the need for a separate structure for fixing the PCB 500.

Also, as the elastic member 600, that is, a member having an elastic property such as, for example, a wave washer, is provided below the PCB 500, the PCB 500 is pushed up to the side of the connecting member 300 and comes into contact with the connecting member 300, and because the PCB 500 avoids direct connection and contact by the connecting member, the PCB 500 can be rotated. Accordingly, there is an advantage in that it is easy to set the direction of the connector 510 in one direction to allow the connection of the PCBs 500 by connecting to the harness 400.

As described in the foregoing, according to one aspect of the present disclosure, only a nut is used to connect ultra capacitors in series, and thus, when connecting a plurality of ultra capacitors, component saving results in curtailment of production costs and reduction in operation time.

Also, the resistance reduces and the heat transfer performance is improved, leading to longer product life.

Also, gas generated during charging and discharging of ultra capacitors is emitted, thereby preventing an explosion.

According to another aspect of the present disclosure, there is no need for separate processing of a bolting part to connect a harness to a connecting member, resulting in reduced manufacturing costs of products.

Also, a member having an elastic property is provided under a printed circuit board (PCB) so that the PCB may rotate in contact with a connecting member, which makes it easy to set a connector in one direction, the connector to which a harness is to be connected.

According to still another aspect of the present disclosure, a PCB is fixed while being inserted into a terminal of a connector, so the need for a separate structure for fixing the PCB is eliminated.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. An ultra capacitor module comprising:
   a terminal formed at one side of an ultra capacitor body;
   a polar terminal disposed on the terminal and having a screw thread formed on an outer peripheral surface;
   a printed circuit board (PCB) having, at a center, a hole through which the polar terminal and the terminal are inserted and penetrate;
   a nut having a screw hole corresponding to the screw thread on an inner peripheral surface and coupled with the polar terminal; and
   an elastic member having, at a center, a hole through which the polar terminal and the terminal are inserted and penetrate and disposed between the ultra capacitor body and the PCB.

2. The ultra capacitor module according to claim 1, further comprising:
   a busbar having, at a center, a hole through which the polar terminal is inserted and penetrates and disposed between the nut and the PCB; and
   a metal member disposed between the nut and the PCB to separate the busbar from the PCB.

3. The ultra capacitor module according to claim 2, wherein the PCB has a cell balancing function of controlling voltage of the ultra capacitor.

4. The ultra capacitor module according to claim 2, wherein a connector is provided at one side of the PCB.

5. The ultra capacitor module according to claim 2, wherein the elastic member is a wave washer.

6. The ultra capacitor module according to claim 2, wherein a groove is formed on an outer surface of the PCB to facilitate the rotation of the PCB.

7. The ultra capacitor module according to claim 2, wherein a diameter of the elastic member is greater than a diameter of the hole formed at the center of the PCB and smaller than a diameter of the PCB.

8. The ultra capacitor module according to claim 2, wherein the nut has a gas emission hole formed from a center to an outer surface.

9. The ultra capacitor module according to claim 1, wherein the PCB has a cell balancing function of controlling voltage of the ultra capacitor.

10. The ultra capacitor module according to claim 1, wherein a connector is provided at one side of the PCB.

11. The ultra capacitor module according to claim 1, wherein the elastic member is a wave washer.

12. The ultra capacitor module according to claim 1, wherein a groove is formed on an outer surface of the PCB to facilitate the rotation of the PCB.

13. The ultra capacitor module according to claim 1, wherein a diameter of the elastic member is greater than a diameter of the hole formed at the center of the PCB and smaller than a diameter of the PCB.

14. The ultra capacitor module according to claim 1, wherein the nut has a gas emission hole formed from a center to an outer surface.

15. The ultra capacitor module according to claim 14, wherein the gas emission hole is formed from a center of an upper surface of an electrode in a lengthwise direction abutting the gas emission hole towards an outer surface along a predetermined distance and is then bent to go straight through to a side surface of the connecting member, or the gas emission hole is formed such that it goes from a center of an upper surface of an electrode in a lengthwise direction abutting the gas emission hole straight through to a side surface of the connecting member.

16. The ultra capacitor module according to claim 1, further comprising:
    a busbar having a central hole portion formed curved vertically in a direction coming into contact with the PCB.

* * * * *